US012713802B2

(12) United States Patent
Fang et al.

(10) Patent No.: US 12,713,802 B2
(45) Date of Patent: Aug. 18, 2026

(54) DISPLAY PANEL

(71) Applicant: HEFEI VISIONOX TECHNOLOGY CO., LTD., Hefei (CN)

(72) Inventors: Xuyang Fang, Hefei (CN); Chaochi Peng, Hefei (CN); Xiaoling Li, Hefei (CN); Mingxing Liu, Hefei (CN); Yu Wang, Hefei (CN); Gang Wang, Hefei (CN); Shuaiyan Gan, Hefei (CN)

(73) Assignee: HEFEI VISIONOX TECHNOLOGY CO., LTD., Hefei (CN)

( * ) Notice: Subject to any disclaimer, the term of this patent is extended or adjusted under 35 U.S.C. 154(b) by 574 days.

(21) Appl. No.: 18/343,005

(22) Filed: Jun. 28, 2023

(65) Prior Publication Data

US 2023/0337499 A1 Oct. 19, 2023

Related U.S. Application Data

(63) Continuation of application No. PCT/CN2021/121538, filed on Sep. 29, 2021.

(30) Foreign Application Priority Data

Dec. 28, 2020 (CN) ........................ 202011596899.X

(51) Int. Cl.

*H10K 59/35* (2023.01)
*H10K 59/121* (2023.01)
*H10K 59/131* (2023.01)
*H10K 59/90* (2023.01)

(52) U.S. Cl.

CPC ....... *H10K 59/353* (2023.02); *H10K 59/1213* (2023.02); *H10K 59/131* (2023.02); *H10K 59/90* (2023.02)

(58) Field of Classification Search

CPC .... H10K 59/353; H10K 59/90; H10K 59/121; H10K 59/131

See application file for complete search history.

(56) References Cited

U.S. PATENT DOCUMENTS

2021/0065625 A1* 3/2021 Wang .................. G09G 3/3233

FOREIGN PATENT DOCUMENTS

| | | |
|---|---|---|
| CN | 110911440 A | 3/2020 |
| CN | 111028765 A | 4/2020 |
| CN | 111046599 A | 4/2020 |
| CN | 111129102 A | 5/2020 |
| CN | 111162105 A | 5/2020 |

(Continued)

OTHER PUBLICATIONS

International Search Report issued on Nov. 22, 2021, in corresponding International Application No. PCT/CN2021/121538, 6 pages.

(Continued)

*Primary Examiner* — Douglas M Menz
(74) *Attorney, Agent, or Firm* — Maier & Maier, PLLC

(57) ABSTRACT

A display panel includes a first display region with multiple light-transmitting sub-pixels and multiple non-light-transmitting sub-pixels. The multiple light-transmitting sub-pixels and the multiple non-light-transmitting sub-pixels are arranged in a preset pixel arrangement structure in the first display region. The multiple non-light-transmitting sub-pixels are randomly arranged in at least one set region of the first display region.

17 Claims, 7 Drawing Sheets

(56) References Cited

FOREIGN PATENT DOCUMENTS

| | | | |
|---|---|---|---|
| CN | 111208648 | A | 5/2020 |
| CN | 111293158 | A | 6/2020 |
| CN | 111681560 | A | 9/2020 |
| CN | 111816788 | A | 10/2020 |
| CN | 112687193 | A | 4/2021 |

OTHER PUBLICATIONS

Office Action issued on Dec. 3, 2021, in corresponding Chinese Application No. 202011596899.X , 22 pages.
Office Action issued on Sep. 2, 2022, in corresponding Taiwan Application No. 110137970 , 12 pages.
Office Action issued on May 9, 2022, in corresponding Chinese Application No. 202011596899.X , 8 pages.

* cited by examiner

DISPLAY PANEL

CROSS REFERENCE TO RELATED APPLICATIONS

This application is a continuation of International Patent Application No. PCT/CN2021/121538, filed on Sep. 29, 2021, which is based on and claims priority to Chinese Patent Application No. 202011596899.X filed with the China National Intellectual Property Administration (CNIPA) on Dec. 28, 2020, the disclosures of which are incorporated herein by reference in their entireties.

TECHNICAL FIELD

Embodiments of the present application relate to the field of display technologies, for example, a display panel.

BACKGROUND

Full screen has become a trend in the development of display panels.

The full-screen display panel in the related art cannot guarantee both a better display effect and a better shooting effect of the imaging region.

SUMMARY

The present application provides a display panel to achieve both a better display effect and a better shooting effect of the imaging region.

Embodiments of the present application provide a display panel. The display panel includes a first display region with multiple light-transmitting sub-pixels and multiple non-light-transmitting sub-pixels.

The multiple light-transmitting sub-pixels and the multiple non-light-transmitting sub-pixels are arranged in a preset pixel arrangement structure in the first display region. The multiple non-light-transmitting sub-pixels are randomly and irregularly arranged in at least one set region of the first display region. The at least one set region includes at least a portion of the first display region.

DETAILED DESCRIPTION

The present application is described below in conjunction with drawings and embodiments.

As mentioned in the background, the full-screen display panel in the related art cannot guarantee both a better display effect and a better shooting effect of the imaging region. The reason for the above situation is that the imaging region of the full-screen display panel is usually provided with non-light-transmitting sub-pixels. The non-light-transmitting sub-pixels in the imaging region are usually arranged regularly. The higher the pixel density of the imaging region is, the better the display effect is. However, the higher the pixel density is, the stronger the diffraction effect of the regularly arranged non-light-transmitting sub-pixels on visible light is, and the worse the shooting and imaging effect is. The smaller the pixel density of the imaging region is, the weaker the diffraction effect of the regularly arranged non-light-transmitting sub-pixels on visible light is, and the better the shooting and imaging effect is, but the worse the display effect is. Therefore, the full-screen display panel in the related art cannot realize both high pixel density and weak diffraction effect in the imaging region, and thus fails to guarantee both a better display effect and a better shooting effect in the imaging region.

Figure 1:
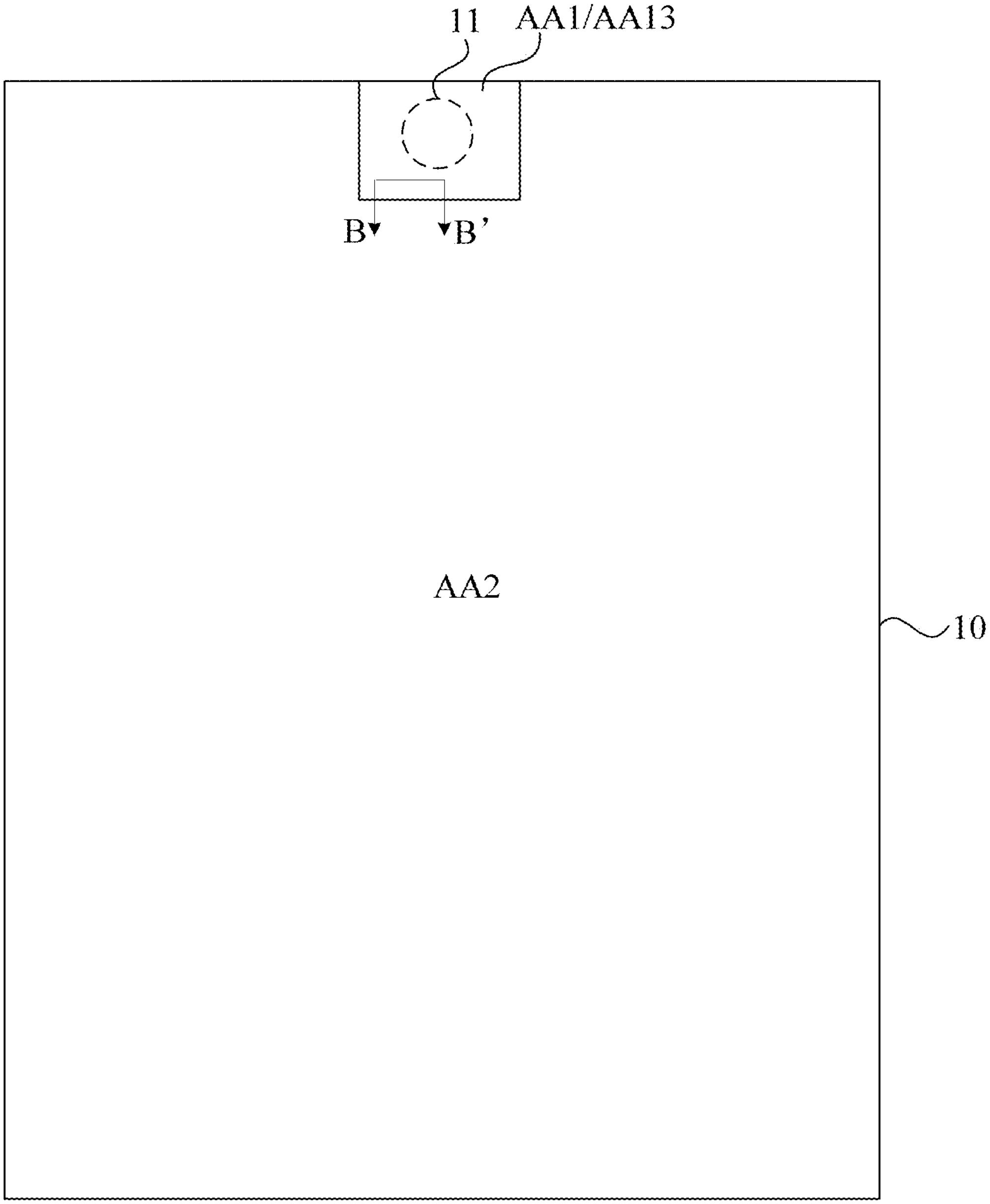
FIG. 1 is a top view of a display panel according to an embodiment of the present application.
Figure 2:
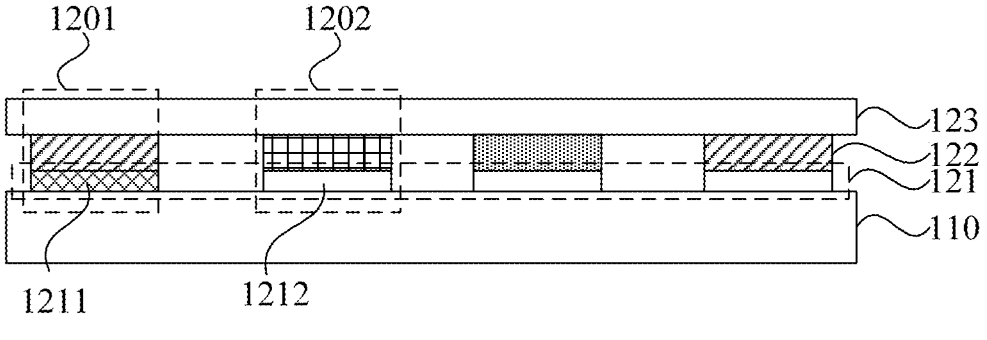
FIG. 2 is a sectional view of a display panel according to an embodiment of the present application.
Figure 3:
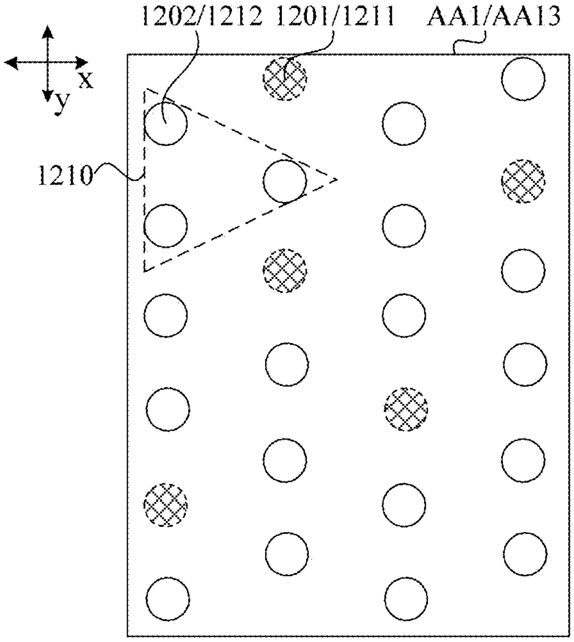
FIG. 3 is an enlarged view of the first display region AA1 of FIG. 1.

For the above reasons, an embodiment of the present application provides a display panel. FIG. 1 is a top view of a display panel according to an embodiment of the present application. FIG. 2 is a sectional view of a display panel according to an embodiment of the present application. FIG. 2 may be a sectional view taken along B-B' of FIG. 1. FIG. 3 is an enlarged view of the first display region AA1 of FIG. 1. FIG. 3 may be an enlarged view of a set region AA13 of FIG. 1. With reference to FIGS. 1 to 3, a display panel 10 includes a first display region AA1 with light-transmitting sub-pixels 1201 and non-light-transmitting sub-pixels 1202. The light-transmitting sub-pixels 1201 and the non-light-transmitting sub-pixels 1202 are arranged in a preset pixel arrangement structure in the first display region AA1. The non-light-transmitting sub-pixels 1202 are randomly and irregularly arranged in a set region AA13 in the first display region AA1. The set region AA13 includes at least a portion of the first display region AA1.

With reference to FIG. 2, the display panel includes an array substrate 110 and multiple light-emitting devices located on one side of the array substrate 110. One light-emitting device includes a first electrode, a light-emitting layer, and a second electrode that are stacked beginning from the array substrate 110 to a direction away from the array substrate 110. Each sub-pixel may include a light-emitting device.

With reference to FIG. 1, the first display region AA1 may be an imaging region of the display panel. For example, a photosensitive element 11, such as a camera, may be configured below the first display region AA1. The display panel may further include a second display region AA2 connected to the first display region AA1. The light transmittance of the first display region AA1 may be greater than that of the second display region AA2.

The light-emitting device included in the light-transmitting sub-pixel 1201 and the light-emitting device included in the non-light-transmitting sub-pixel 1202 may be an organic light-emitting device or an inorganic light-emitting device. When the light-emitting device is an organic light-emitting device, for example, the first electrode is the anode of the light-emitting device, and the second electrode is the cathode of the light-emitting device. The light-emitting layers may include organic light-emitting layers of different emitted colors, such as a red light-emitting layer, a green light-emitting layer, and a blue light-emitting layer. Accordingly, a light-emitting device including a red light-emitting layer is a red light-emitting device, a light-emitting device including a green light-emitting layer is a green light-emitting device, and a light-emitting device including a blue light-emitting layer is a blue light-emitting device.

In an embodiment, with reference to FIG. 1, the set area AA13 may be a portion of the first display region AA1 or the entire region of the first display region AA1. When the set region AA13 is a portion of the first display region AA1, the first display region AA1 may include one set area AA13 or multiple set regions AA13. When the set region AA13 is the entire region of the first display region AA1, the first display region AA1 includes only one set region AA13. FIG. 3 illustratively shows a situation where the set region AA13 is the entire region of the first display region AA1.

Figure 4:
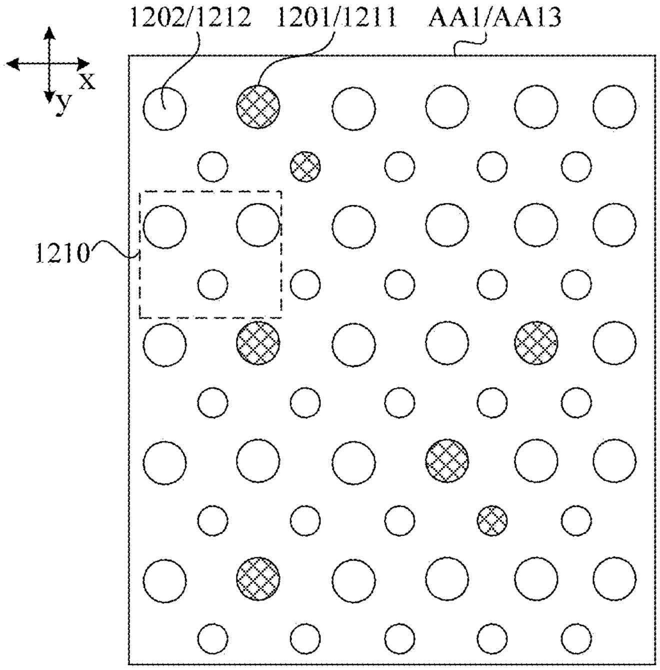
FIG. 4 is another enlarged view of the first display region AA1 of FIG. 1.

FIG. 4 is another enlarged view of the first display region AA1 of FIG. 1. FIG. 4 may be an enlarged view of the set region AA13 of FIG. 1. In conjunction with FIGS. 1, 3 and 4, in an embodiment, the first display region AA1 includes multiple pixel units 1210 arranged in the preset pixel arrangement structure. Each pixel unit 1210 includes multiple sub-pixels, and each sub-pixel is selected from the light-transmitting sub-pixels 1201 or the non-light-transmitting sub-pixels 1202.

The preset pixel arrangement structure rule may be any kind of pixel arrangement structure. For example, the arrangements of sub-pixels in the pixel unit 1210 include a diamond arrangement (see FIG. 4), a triangular arrangement (see FIG. 3), and a quadrilateral arrangement. The quadrilateral arrangement may be, for example, a trapezoidal arrangement.

The pixel arrangement of the sub-pixels in the pixel unit may be a RGB arrangement, a RGBG arrangement, a pentile arrangement (diamond arrangement), a RGBW arrangement (compared to the RGB arrangement, the RGBW has one more white sub-pixel), a RGB Delta arrangement (a type of RGB arrangement developed by Chinese manufacturers), a RGB S-Strip arrangement (B sub-pixels are configured longitudinally, R and G sub-pixels are configured horizontally) and other arrangement.

In an embodiment, the random and irregular arrangement of the non-transmitting sub-pixels 1202 in the set region AA13 of the first display region AA1 may refer to an irregular arrangement of the non-transmitting sub-pixels 1202 in the set region AA13 of the first display region AA1. The irregular arrangement means that the relative position of the non-light-transmitting sub-pixels 1202 in the set region AA13 is not fixed in the pixel unit 1210. For example, in one pixel unit 1210, red sub-pixels are non-transmitting sub-pixels. In another pixel unit 1210, green sub-pixels are non-transmitting sub-pixels. In one pixel unit 1210, blue sub-pixels may be non-transmitting sub-pixels. Pixel units excluding non-transmitting sub-pixels 1202 may also exist.

As analyzed above about the reasons for the defects in the background, the regularly arranged non-transmitting sub-pixels have a relatively strong diffraction effect on visible light. When the pixel density is higher, the regularly arranged non-light-transmitting sub-pixels have a stronger diffraction effect on visible light. In the above embodiments, the non-transmitting sub-pixels 1202 are arranged randomly and irregularly in the set region AA13 of the first display region AA1, which can reduce the diffraction effect of the non-light-transmitting sub-pixels on the light. Moreover, since the first display region AA1 further includes light-transmitting sub-pixels 1201, the configuration of the light-transmitting sub-pixels 1201 has a weak diffraction effect on visible light, so the impact on imaging quality is small, but the impact on improving the display effect is relatively great. Therefore, the first display region AA1 includes light-transmitting sub-pixels 1201 and non-light-transmitting sub-pixels 1202, the non-light-transmitting sub-pixels 1202 are randomly and irregularly arranged in the set region AA13 of the first display region AA1, and the light-transmitting sub-pixels 1201 and the non-light-transmitting sub-pixels 1202 are arranged in a preset pixel arrangement structure in the first display region. This configuration can reduce the diffraction effect, and realize the high pixel density of the first display region AA1 to ensure the display effect. Therefore, the display panel of the present embodiments may take into account the first display region AA1, such as the imaging region, and thus have a better display and a better shooting effect.

The display panel according to embodiments of the present application includes, by configuration, a first display region with light-transmitting sub-pixels and non-light-transmitting sub-pixels. The light-transmitting sub-pixels and the non-light-transmitting sub-pixels are arranged in a preset pixel arrangement structure in the first display region. The non-light-transmitting sub-pixels are randomly and irregularly arranged in a set region of the first display region. In this manner, the diffraction effect is reduced and a high pixel density in the first display region is achieved, thereby ensuring the display effect. Therefore, the display panel of the present embodiments can guarantee both a better display effect and a better shooting effect of the first display region of the display panel.

With continued reference to FIG. 2, in an embodiment, the display panel includes an array substrate 110, a first electrode layer 121, a light-emitting layer 122, and a second electrode layer 123 stacked in sequence on the basis of the above embodiments. The first electrode layer 121 includes multiple first electrodes. The light-emitting layer 122 includes light-emitting material units in one-to-one correspondence to the first electrodes.

A light-transmitting sub-pixel 1201 includes a first electrode, a light-emitting material unit corresponding to the first electrode of the light-transmitting sub-pixel 1201, and a first portion electrode layer of the second electrode layer 123. A projection of the first portion electrode layer of the second electrode layer 123 in a thickness direction of the display panel overlaps a projection of the first electrode in the light-transmitting sub-pixel 1201 in the thickness direction of the display panel.

A non-light-transmitting sub-pixel 1202 includes a first electrode, a light-transmitting material unit corresponding to the first electrode of the non-light-transmitting sub-pixel 1202, and a second portion electrode layer of the second electrode layer 123. A projection of the second portion electrode layer of the second electrode layer 123 in the thickness direction of the display panel overlaps a projection of the first electrode in the non-light-transmitting sub-pixel 1202 in the thickness direction of the display panel.

The first electrode of the non-light-transmitting sub-pixel 1202 is a non-light-transmitting electrode 1212. The first electrode of the light-transmitting sub-pixel 1201 is a light-transmitting electrode 1211. The first electrode of the nonlight-transmitting sub-pixel 1202 is randomly and irregularly arranged in the set region AA13 of the first display region AA1.

For example, in a sub-pixel, the second electrode layer 123 is light-transmitting so that the light emitted by the light-emitting layer 122 can be transmitted through the second electrode layer 123. The light-emitting material unit included in the light-transmitting sub-pixel 1201 is light-transmitting. The light-emitting material unit included in the non-light-transmitting sub-pixel 1202 may be light-transmitting or non-light-transmitting.

In the present embodiment, the random and irregular arrangement of the non-light-transmitting sub-pixels 1202 in the set region AA13 is realized by configuring the non-light-transmitting electrodes 1212 to be randomly and irregularly arranged in the set region AA13, thereby ensuring that the first display region AA1 has a reduced diffraction effect on light. In other embodiments of the present application, when the light-emitting material units of the non-light-transmitting sub-pixels 1202 do not transmit light, the random and irregular arrangement of the non-light-transmitting sub-pixels 1202 in the set region AA13 can also be achieved by configuring the non-light-transmitting material units to be randomly and irregularly arranged in the set region AA13.

For example, the light-transmitting electrode 1211 and the non-light-transmitting electrode 1212 in the first electrode layer 121 may be formed such that after the array substrate 110 is fabricated, the regular non-light-transmitting first electrode arranged in an array, namely, the non-light-transmitting electrode 1212 is fabricated, and then a portion of the light-transmitting electrode 1212 is randomly removed, for example, by etching. And the light-transmitting electrode 1211 is formed at the position of the removed non-light-transmitting electrode 1212. In this manner, the final first electrodes are still arranged in an array, the non-light-transmitting electrodes 1212 are randomly and irregularly arranged, and the light-transmitting electrodes 1211 are also randomly and irregularly arranged.

On the basis of the above embodiments, in an embodiment, the non-light-transmitting electrode 1212 includes a first transparent conductive layer, a metal conductive layer and a second transparent conductive layer that are stacked with each other. The light-transmitting electrode 1211 includes a transparent conductive layer. Or the light-transmitting electrode 1211 includes a first transparent conductive layer, a metal conductive layer and a second transparent conductive layer that are stacked with each other. A thickness of the metal conductive layer of the light-transmitting electrode 1211 is smaller than a thickness of the metal conductive layer of the non-light-transmitting electrode 1212.

In an embodiment, the material of the first transparent conductive layer, the material of the second transparent conductive layer, and the material of the transparent conductive layer of the light-transmitting electrode may be low temperature polycrystalline oxide or indium tin oxide. The metal conductive layer may be silver.

The non-light-transmitting electrode 1212 is configured to include a first transparent conductive layer, a metal conductive layer and a second transparent conductive layer that are stacked with each other. In this manner, the non-light-transmitting property of the non-light-transmitting electrode can be ensured on the one hand, and the relatively high hole injection efficiency of the non-light-transmitting electrode can be ensured on the other hand. With the arrangement in which the light-transmitting electrode 1211 includes only a transparent conductive layer, the light-transmitting property of the light-transmitting electrode 1211 can be ensured. The light-transmitting electrode 1211 includes a first transparent conductive layer, a metal conductive layer, and a second transparent conductive layer that are stacked with each other, and the thickness of the metal conductive layer of the light-transmitting electrode 1211 is smaller than the thickness of the metal conductive layer of the non-light-transmitting electrode 1212. In this manner, the light-transmitting electrode 1211 may be a semi-light-transmitting and semi-reflective electrode so that the light-transmitting electrode 1211 has a partial effect of a micro-cavity, which helps to improve the display effect.

Figure 5:
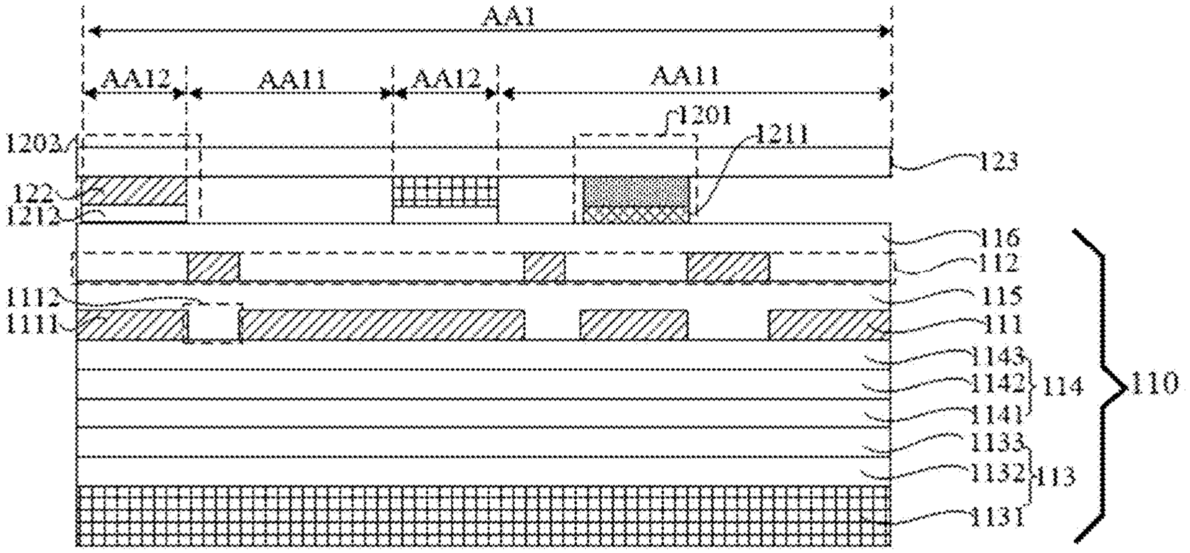
FIG. 5 is a sectional view of another display panel according to an embodiment of the present application.

FIG. 5 is a sectional view of another display panel according to an embodiment of the present application. The sectional view of the display panel of FIG. 5 may still be obtained by taking along B-B' in FIG. 1. With reference to FIG. 5, the array substrate 110 includes multiple layers stacked with each other, part of the layers are light-transmitting layers, and the other part of the layers are non-light-transmitting layers. The non-light-transmitting layers are configured to avoid the light-transmitting electrode 1211, that is, a projection of each of the non-light-transmitting layers in a thickness direction of the array substrate 110 does not overlap a projection of the light-transmitting electrode 1211 in the thickness direction of the array substrate 110.

The light-transmitting layers include a light-transmitting wiring layer 111 located in the first display region AA1. The light-transmitting wiring layer 111 includes light-transmitting wires 1111 and a groove 1112 between adjacent ones of the light-transmitting wires 1111. The groove 1112 serves as a hollowed-out region of the light-transmitting wiring layer 111.

The first display region AA1 includes a light-transmitting region AA11 and a non-light-transmitting region AA12. The non-light-transmitting region AA12 includes a layer structure corresponding to the non-light-transmitting sub-pixel 1202 in the thickness direction of the display panel. The light-transmitting region AA11 includes at least a layer structure corresponding to the light-transmitting sub-pixel 1201 in the thickness direction of the display panel. For example, the wires in the first display region AA1 is configured to be the light-transmitting wires 1111 so that the wiring does not block the light and more light-transmitting regions AA11 may be configured in a region which is not blocked by non-light-transmitting sub-pixels 1202. In this manner, the increased area of the light-transmitting region AA11 in the first display region AA1 is facilitated and the improved light transmittance of the first display region AA1 is facilitated.

With continued reference to FIG. 5, in an embodiment, in the first display region AA1, the display panel further includes a compensation layer 112 located in the array substrate 110. A projection of the compensation layer 112 in the light-transmitting wiring layer 111 covers at least part of the hollowed-out regions in the light-transmitting wiring layer 111.

In an embodiment, the compensation layer 112 is provided in the light-transmitting region AA11. Since the groove 1112 exists in the light-transmitting wiring layer 111, the optical path of the light passing through the position where the light-transmitting wiring layer 111 has the groove 1112 is different from the optical path of the light passing through the position where the light-transmitting wiring layer 111 does not have the groove 1112. And the groove 1112 forms a structure similar to a slit or a small hole on the light-transmitting wiring layer 111, so the light is prone to diffraction when passing through such a structure, thereby affecting the final light quality.

In view of this situation, in this embodiment, a compensation layer 112 is provided in the display panel. The compensation layer 112 is also a layer formed through a patterning process. A projection of the compensation layer 112 on the light-transmitting wiring layer 111 covers at least part of the hollowed-out regions in the light-transmitting wiring layer 111, namely, the position of the groove 1112. In other words, the projection of the compensation layer 112 on the light-transmitting wiring layer 111 may fill part of the vacancy of the light-transmitting wiring layer 111 in the hollowed-out region so that at least the optical path of part of the light passing through the position where the light-transmitting wiring layer 111 has a groove 1112 is the same as the optical path of part of the light which does not pass through the position where the light-transmitting wiring layer 111 has a groove 1112. In this manner, the phase difference of at least part of the light is reduced, the diffraction when the light passes through the light-transmitting wiring layer 111 is reduced, and the shooting effect is improved.

In the present embodiment, the material of the compensation layer 112 may be silicon oxide, silicon nitride, silicon oxynitride, monocrystalline silicon or indium tin oxide, and the like. In other words, the material of the compensation layer 112 does not need to be the same as the material of the light-transmitting wiring layer 111, so long as the compensation function of the amplitude and phase of the light passing through can be realized.

On the basis of the above embodiments, in an embodiment, the projection of the compensation layer 112 on the light-transmitting wiring layer 111 completely coincides with the hollowed-out regions in the first display region AA1.

By configuring the projection of the compensation layer 112 on the light-transmitting wiring layer 111 to completely coincide with the hollowed-out regions, that is, the compensation layer 112 and the light-transmitting wiring layer 111 form a complementary shape, the difference in the optical path in multiple places in the display panel can be reduced, the diffraction when the light passes through is reduced, and the shooting effect is improved.

In an embodiment, the material of the compensation layer 112 is the same as the material of the light-transmitting wiring layer 111. For example, the compensation layer 112 and the light-transmitting wiring layer 111 are both made of indium tin oxide. When the material of the compensation layer 112 is the same as the material of the light-transmitting wiring layer 111, the compensation layer 112 can simultaneously compensate for the amplitude and phase difference when the light passes through the groove 1112 and the light-transmitting wiring layer 111, thereby reducing the diffraction.

In an embodiment, a thickness of the compensation layer 112 is equal to a thickness of the light-transmitting wiring layer 111. When the thickness of the compensation layer 112 is equal to the thickness of the light-transmitting wiring layer 111, since the materials of the compensation layer 112 and the light-transmitting wiring layer 111 are the same, the compensation layer 112 can completely compensate for the amplitude and phase difference when the light passes through the groove 1112 and the light-transmitting wiring layer 111, thereby theoretically eliminating the diffraction.

On the basis of the above embodiments, in an embodiment, the array substrate 110 includes an underlayer 113, an insulating layer 114, a light-transmitting wiring layer 111, a first planarization layer 115, a compensation layer 112, and a second planarization layer 116 that are stacked with each other. In the present embodiment, the underlayer 113 includes a substrate 1131, a first underlayer insulating layer 1132, and a second underlayer insulating layer 1133. The substrate 1131 may be a flexible substrate or a rigid substrate. When the substrate 1131 is a flexible substrate, the display screen can have good bending performance. The first underlayer insulating layer 1132 and the second underlayer insulating layer 1133 may be made of silicon oxide, silicon nitride or silicon oxynitride. The materials of the first underlayer insulating layer 1132 and the second underlayer insulating layer 1133 are different. The insulating layer 114 includes a gate insulating layer 1141, a capacitor insulating layer 1142 and an interlayer dielectric layer 1143.

Figure 6:
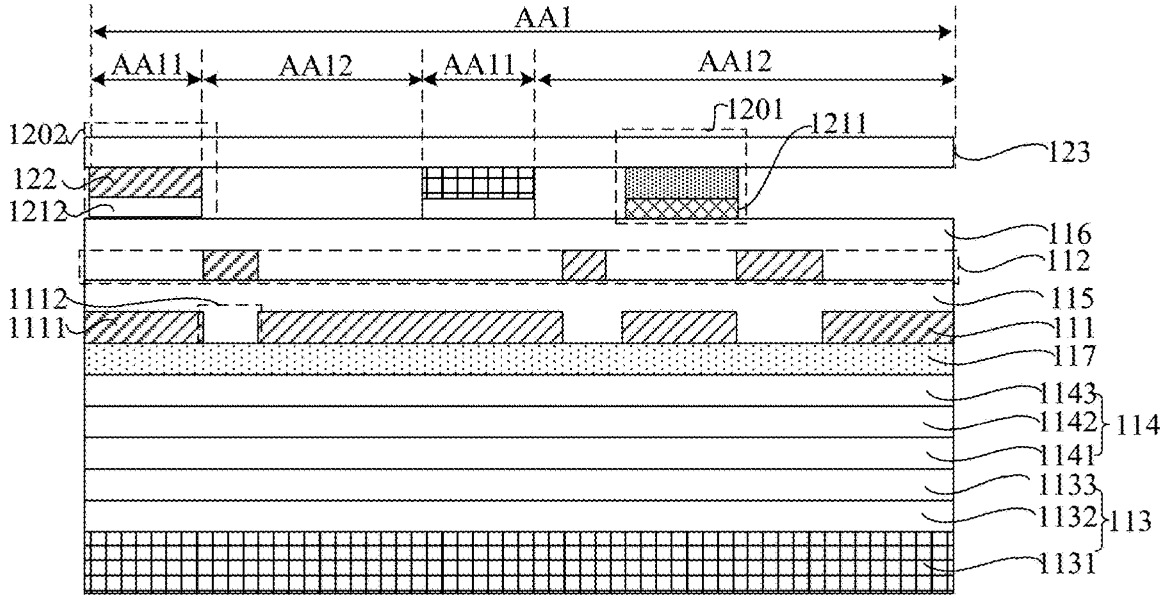
FIG. 6 is a sectional view of another display panel according to an embodiment of the present application.

FIG. 6 is a sectional view of another display panel according to an embodiment of the present application. The sectional view of the display panel in FIG. 6 may still be obtained by taking along B-B' in FIG. 1. With reference to FIG. 6, the first display region AA1 further includes at least one optical modulation layer 117 sandwiched between two adjacent ones of the light-transmitting layers. The optical modulation layer 117 is configured to increase a transmittance of light with a preset wavelength passing through the two adjacent ones of the light-transmitting layers between which the optical modulation layer is sandwiched.

FIG. 6 illustratively shows a structure in which the optical modulation layer 117 is provided between the insulating layer 114 and the light-transmitting wiring layer 111. The optical modulation layer 117 may also be provided between other adjacent light-transmitting layers. The display panel of the present embodiment may increase the transmittance of some wavelengths of light with low transmittance to be close to or even equal to the transmittance of wavelengths of light with relatively high transmittance, thereby improving the uniformity of spectral transmission and color fidelity of transmitted light.

In an embodiment, the refractive index of the optical modulation layer 117 is between the refractive indices of two adjacent ones of the light-transmitting layers between which the optical modulation layer is sandwiched.

In some embodiments, the refractive index of the optical modulation layer 117 satisfies the following formula (1):

$$n_C = \sqrt{\left(\frac{1-\sqrt{1-\alpha}}{1+\sqrt{1-\alpha}}\right)(n_A \times n_B)} \tag{1}$$

In the formula, $n_A$ is the refractive index of one of the adjacent light-transmitting layers between which the optical modulation layer is sandwiched. $n_B$ is the refractive index of the other of the adjacent light-transmitting layers between which the optical modulation layer is sandwiched. $n_C$ is the refractive index of the optical modulation layer 117. $\alpha$ is the efficiency rate. The efficiency rate $\alpha$ is greater than or equal to 60%. The higher the value of the efficiency rate $\alpha$ is, the closer the refractive index $n_C$ of the optical modulation layer 117 is to the geometric mean $\sqrt{n_A \times n_B}$ of the refractive indices $n_A$ and $n_B$ of the adjacent light-transmitting layers. The effective rate $\alpha$ is greater than or equal to 60% so that the optical modulation layer 117 can enhance the transmittance of the preset wavelength of light passing through the two adjacent ones of the light-transmitting layers.

In some embodiments, the refractive index of the optical modulation layer 117 satisfies the following formula (2):

$$n_C = \sqrt{n_A \times n_B} \quad (2)$$

In the formula, $n_A$ is the refractive index of one of the adjacent light-transmitting layers between which the optical modulation layer is sandwiched. $n_B$ is the refractive index of the other of the adjacent light-transmitting layers between which the optical modulation layer is sandwiched. $n_C$ is the refractive index of the optical modulation layer 117. Formula (2) is obtained when the efficiency rate in formula (1) is configured to be 100%. When the refractive index $n_C$ of the optical modulation layer 117 satisfies formula (2), a preferable value of the refractive index $n_C$ for light modulation is obtained. At this time, the optical modulation layer 117 can greatly increase the transmittance of a preset wavelength of light passing through the two adjacent ones of the light-transmitting layers. The efficiency rate $\alpha$ in the above formula (1) can be understood as the effective degree to which the modulation performance of the optical modulation layer 117 can reach the preferable modulation performance. The preferable modulation performance refers to the modulation performance corresponding to the preferable value of the refractive index $n_C$.

FIG. 6 illustratively shows a structure in which the display panel includes both the compensation layer 112 and the optical modulation layer 117. The display panel may only include any one of the compensation layer 112 or the optical modulation layer 117.

Figure 7:
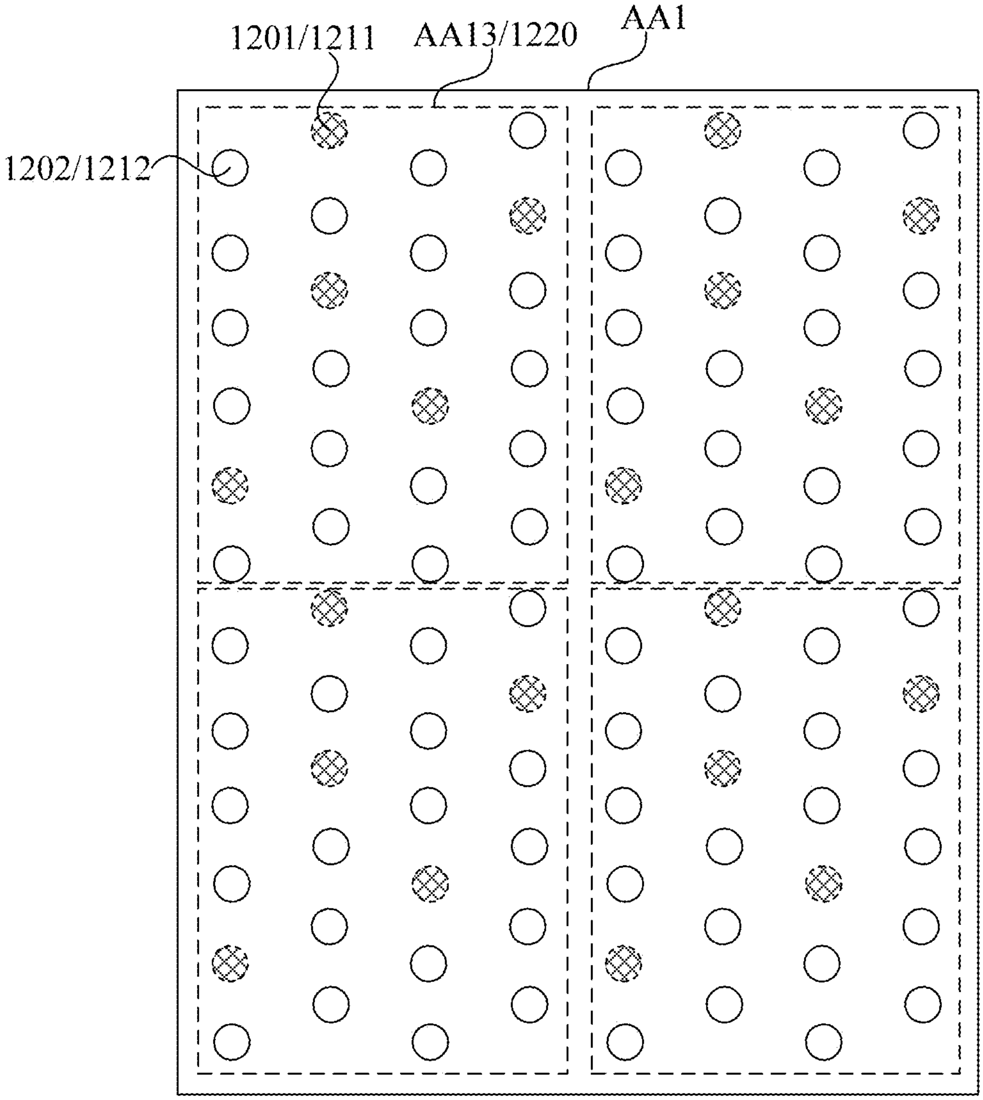
FIG. 7 is a partially enlarged view of another display panel according to an embodiment of the present application.

FIG. 7 is a partially enlarged view of another display panel according to an embodiment of the present application. The partially enlarged view may be a partial enlarged view of the first display region AA1 in FIG. 1. With reference to FIG. 7, the first display region AA1 includes multiple set regions AA13. Each set region AA13 includes a minimum repeating unit 1220 of pixel arrangement. Minimum repeating units 1220 in the first display region AA1 are the same in terms of an arrangement mode of light-transmitting sub-pixels and in terms of an arrangement mode of non-light-transmitting sub-pixels. The non-light-transmitting sub-pixels 1202 in each of the minimum repeating units 1220 are randomly and irregularly arranged.

Two minimum repeating units 1220 are the same in terms of an arrangement mode of light-transmitting sub-pixels and in terms of an arrangement mode of non-light-transmitting sub-pixels, which means that one minimum repeating unit 1220 can be obtained by translating another minimum repeating unit 1220 in a fixed direction. The minimum repeating unit 1220 includes multiple sub-pixels. The arrangement of the sub-pixels in the first display region AA1 may be obtained by translating the minimum repeating unit 1220 in different directions. FIG. 7 illustratively shows a situation where the first display region AA1 includes four set regions AA13. When the non-transmitting sub-pixels 1202 are included in the set region AA13, the more random the arrangement of the non-light-transmitting sub-pixels 1202 is, the worse the display effect is, and the weaker the diffraction effect on visible light is, the better the shooting effect is. The smaller the minimum repeating unit 1220 of the pixel arrangement is, the weaker the randomness of the arrangement is; the larger the minimum repeating unit 1220 of the pixel arrangement is, the stronger the randomness of the arrangement is. For the situation in FIG. 3, when the set region AA13 is the entire region of the first display region AA1 and the first display region AA1 only includes one set region AA13, the minimum repeating unit 1220 is distributed throughout the entire first display region AA1, corresponding to the largest minimum repeating unit 1220 at this time. The first display region AA1 is configured to include multiple set regions AA13, each set region AA13 includes a minimum repeating unit 1220, and the minimum repeating units 1220 includes light-transmitting sub-pixels 1201 and non-light-transmitting sub-pixels 1202. The non-light-transmitting sub-pixels 1202 are randomly and irregularly arranged in the minimum repeating unit 1220. The arrangement of pixels in different minimum repeating units 1220 is the same, for example, the light-transmitting sub-pixels 1201 are arranged in the same way, and the non-light-transmitting sub-pixels 1202 are arranged in the same way. The overall arrangement of the non-light-transmitting sub-pixels 1202 in the entire first display region AA1 is relatively orderly so that on the basis of ensuring a better display effect, the random and irregular arrangement of the non-light-transmitting sub-pixels 1202 in the set region AA13 is realized. In this manner, the diffraction effect of the first display region AA1 on visible light is relatively weak, thereby ensuring a better shooting effect.

With continued reference to FIG. 7, the minimum repeating unit 1202 includes at least two columns of sub-pixels. The non-light-transmitting sub-pixels 1202 of in each column of at least one column of the at least two columns of sub-pixels is arranged differently from non-light-transmitting sub-pixels 1202 in another column of the at least two columns of sub-pixels. And/or the minimum repeating unit 1220 includes at least two rows of sub-pixels, and non-light-transmitting sub-pixels 1220 in each row of at least one row of the at least two rows of sub-pixels is arranged differently from non-light-transmitting sub-pixels 1220 in another row of the at least two rows of sub-pixels.

For example, arranged differently includes a situation where the arrangement is not completely the same. The arrangement is not completely the same, which means that part of the arrangement may be the same and part of the arrangement may be different.

For example, the display panel further includes data lines and scanning lines. The extending direction of the data lines intersects with the extending direction of the scanning lines. The column direction y of the sub-pixels is the same as the extending direction of the data lines, and the row direction x of the sub-pixels is the same as the extending direction of the scanning lines. In the columns of sub-pixels in the minimum repeating unit 1220, the arrangement of the non-light-transmitting sub-pixels 1202 is not completely the same, which may mean that in the minimum repeating unit 1220, the non-light-transmitting sub-pixels 1202 in at least one column of sub-pixels cannot be obtained by translating any other column of non-light-transmitting sub-pixels 1202. Similarly, the arrangement of the non-light-transmitting sub-pixels 1202 in multiple rows of sub-pixels is not completely the same, which means that the non-light-transmitting sub-pixels 1202 in at least one row of sub-pixels cannot be obtained by translating any other row of non-light-transmitting sub-pixels 1202. The arrangement of the minimum repeating units 1220 in the present embodiment can ensure that the non-light-transmitting sub-pixels 1202 are arranged relatively randomly, which helps to ensure the shooting effect under the premise of high pixel density.

In an embodiment, the minimum repeating unit 1220 includes at least two columns of sub-pixels, and the number of non-light-transmitting sub-pixels 1202 in each column of at least one column of the at least two columns of sub-pixels is different from the number of non-light-transmitting sub-pixels 1202 in another column of the at least two columns of sub-pixels. And/or the minimum repeating unit 1220 includes at least two rows of sub-pixels, and the number of non-light-transmitting sub-pixels 1202 in each row of at least one row of the at least two rows of sub-pixels is different from the number of non-light-transmitting sub-pixels 1202 in another row of the at least two rows of sub-pixels. The arrangement of the minimum repeating unit 1220 in the present embodiment can also ensure that the non-light-transmitting sub-pixels 1202 are arranged relatively randomly, which helps to ensure the shooting effect under the premise of high pixel density.

In an embodiment, the minimum repeating unit 1220 includes at least two columns of sub-pixels. In each column of the at least two columns of sub-pixels, a distance between two adjacent non-light-transmitting sub-pixels 1202 constituting a pair among at least one pair of non-light-transmitting sub-pixels 1202 is different from a distance between two adjacent non-light-transmitting sub-pixels 1202 constituting a pair other than the at least one pair of non-light-transmitting sub-pixels 1202. And/or the minimum repeating unit 1220 includes at least two rows of sub-pixels, and in each row of the at least two rows of sub-pixels, a distance between two adjacent non-light-transmitting sub-pixels 1202 constituting a pair among at least one pair of non-light-transmitting sub-pixels 1202 is different from a distance between two adjacent non-light-transmitting sub-pixels 1202 constituting a pair other than the at least one pair of non-light-transmitting sub-pixels 1202. The arrangement of the minimum repeating unit 1220 in the present embodiment can also ensure that the non-light-transmitting sub-pixels 1202 are arranged relatively randomly, which helps to ensure the shooting effect under the premise of high pixel density.

With continued reference FIG. 7, in an embodiment, the range of the ratio of the number of light-transmitting sub-pixels 1201 in the first display region AA1 to the total number of sub-pixels in the first display region AA1 is 10% to 30%. The sub-pixels include light-transmitting sub-pixels and non-light-transmitting sub-pixels.

For example, the greater the proportion of non-light-transmitting sub-pixels 1202 in the first display region AA1 is, the better the display effect is. The greater the proportion of light-transmitting sub-pixels 1201 is, the greater the randomness of the arrangement of the non-light-transmitting sub-pixels 1202 is so that the diffraction effect is weaker, the transmittance is higher, and the shooting effect is better. In the present embodiment, the range of the ratio of the number of light-transmitting sub-pixels 1201 in the first display region AA1 to the total number of sub-pixels in the first display region AA1 is configured to be 10% to 30%, so as to ensure both a better display effect and a better shooting effect of the first display region AA1.

The area of each sub-pixel may be adjusted according to application conditions. In an embodiment, the area of the sub-pixels may be configured according to the luminous efficiency of the sub-pixels of different colors, that is, the higher the luminous efficiency of a light-emitting device is, the smaller the area of the sub-pixels is, and the lower the luminous efficiency of a light-emitting device is, the larger the area of the sub-pixels is.

With continued reference to FIG. 7, in an embodiment, sub-pixels in the minimum repeating unit 1220 are arranged in an array. At least one column of sub-pixels includes light-transmitting sub-pixels 1201.

In an embodiment, each column of the at least two columns of sub-pixels includes light-transmitting sub-pixels 1201. In different columns of the minimum repeating units 1220, the row positions of the light-transmitting sub-pixels 1201 are not completely the same. Such configuration can ensure that the distribution of the light-transmitting sub-pixels 1201 in the first display region AA1 has a certain degree of randomness and correspondingly, the distribution of the non-light-transmitting sub-pixels 1202 in the first display region AA1 has a certain degree of randomness, thereby reducing the diffraction effect of the first display region AA1 on the light and helping to improve the shooting effect.

In an embodiment, the light-transmitting sub-pixels 1201 serve as red sub-pixels and/or blue sub-pixels. At least a portion of the non-light-transmitting sub-pixels 1202 serve as green sub-pixels.

For example, since the green sub-pixel contributes the most to the luminance of the display panel, configuring the green sub-pixel to be the light-transmitting sub-pixel 1201 greatly affects the display effect of the display panel. Therefore, in the present embodiment, the light-transmitting sub-pixels 1201 serve as red sub-pixels and/or blue sub-pixels instead of green sub-pixels so that the better display effect of the display panel is ensured on the basis of ensuring that the distribution of non-light-transmitting sub-pixels 1202 is relatively random. However, since the number of light-transmitting sub-pixels 1201 is less than that of the non-light-transmitting sub-pixels 1202, some of the non-light-transmitting sub-pixels 1202 serve as green sub-pixels, and the rest of the non-light-transmitting sub-pixels 1202 serve as red sub-pixels and/or blue sub-pixels.

In an embodiment, the number of green light-transmitting sub-pixels in each minimum repeating unit 1220 is no more than three. In the present embodiment, the light-transmitting sub-pixels 1201 are allowed to be green sub-pixels, but the number of green light-transmitting sub-pixels in the minimum repeating unit 1220 is no more than three, which can ensure that the distribution of the light-transmitting sub-pixels 1201 and the light-transmitting sub-pixels 1202 is more random, and the first display region AA1 has a weaker diffraction effect on light. At the same time, since the number of green light-transmitting sub-pixels included in each minimum repeating unit 1220 is small, the impact on the display effect is also small.

Figure 8:
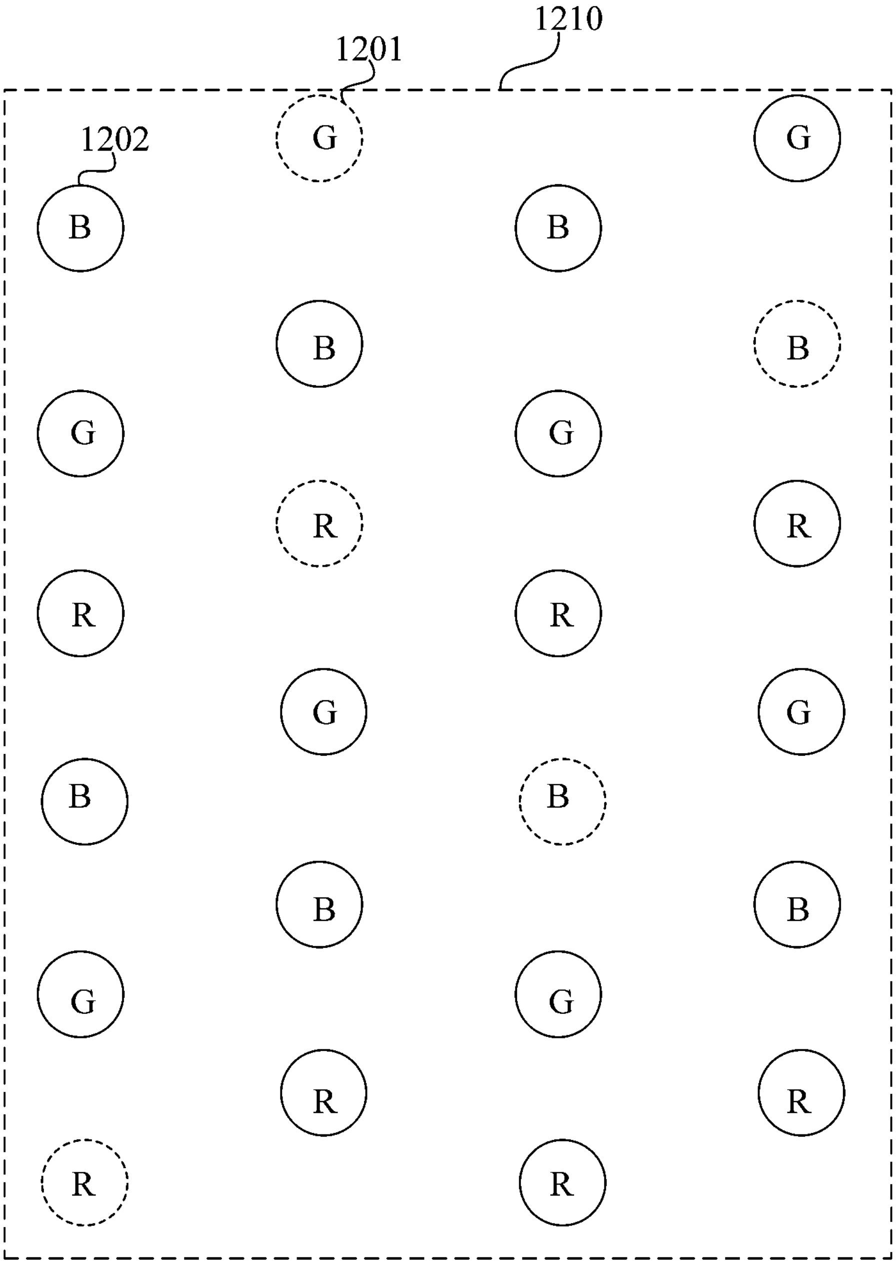
FIG. 8 is a diagram illustrating the structure of a minimum repeating unit according to an embodiment of the present application.

FIG. 8 is a diagram illustrating the structure of a minimum repeating unit according to an embodiment of the present application. With reference to FIG. 8, the pixel arrangement in the display panel may be a pixel arrangement structure in FIG. 8, where R represents a red sub-pixel, G represents a green sub-pixel, B represents a blue sub-pixel, the sub-pixel of the solid line is a non-light-transmitting sub-pixel 1202, and the sub-pixel of the dotted line is a light-transmitting sub-pixel 1201. The minimum repeating unit 1220 may include 24 sub-pixels. When the proportion of the light-transmitting sub-pixels 1201 is fixed, for example, when the proportion of the light-transmitting sub-pixels 1201 is 5/24, 5 sub-pixels may be randomly configured to be the light-transmitting sub-pixels 1201 among the 24 sub-pixels, and the rest are non-light-transmitting sub-pixels 1202. The number of green light-transmitting sub-pixels 1201 is no more than three, for example, the number of green light-transmitting sub-pixels in the minimum repeating unit 1220 in FIG. 8 is one.

Figure 9:
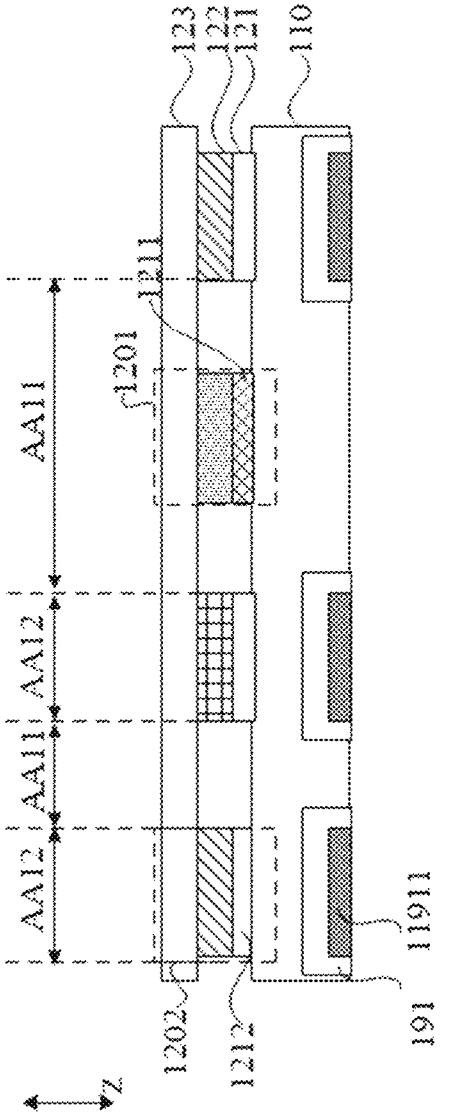
FIG. 9 is a sectional view of another display panel according to an embodiment of the present application.

FIG. 9 is a sectional view of another display panel according to an embodiment of the present application. The sectional view of the display panel in FIG. 9 may still be obtained by taking along B-B' in FIG. 1. With reference to FIG. 9, in an embodiment, in a thickness direction z of the display panel in the first display region AA1, each of at least part of layers is provided with a plurality of first pixel circuits 191. Each first pixel circuit 191 is electrically connected to the corresponding non-light-transmitting sub-pixel 1202. Each first pixel circuit 191 is correspondingly connected to at least one non-light-transmitting sub-pixel 1202.

For example, each first pixel circuit 191 may be connected to one non-light-transmitting sub-pixel 1202, or may be connected to multiple non-light-transmitting sub-pixels 1202. When each first pixel circuit 191 is connected to multiple non-light-transmitting sub-pixels 1202, a smaller number of first pixel circuits 191 may drive more sub-pixels, thereby reducing the total area of the first pixel circuits 191 in the first display region AA1, helping to reduce the area of the non-light-transmitting regions AA12, and thus improving the light transmittance of the first display region AA1.

The layers in which the first pixel circuits 191 are formed may include a light-transmitting layer and a non-light-transmitting film layer. The non-light-transmitting layer may include a gate and a capacitor of a thin-layer transistor. The light-transmitting layer may include a light-transmitting wiring layer in the above embodiments.

In an embodiment, the light-transmitting layer where the first pixel circuits 191 are formed is located on a side of the non-light-transmitting layer close to a light-emitting device.

With reference to FIG. 9, a projection of the gate and the capacitor 11911 of the thin-layer transistor included in the first pixel circuit 191 on the array substrate 110 (with reference to FIG. 6, the array substrate 110 includes the underlayer 113) is covered by a non-light-transmitting sub-pixel 1202 connected to the first pixel circuit 191. 11911 represents the overall structure of the gate and the capacitor of the thin-layer transistor.

For example, since the topological area of the gate and the capacitor 11911 of the thin-layer transistor in the first pixel circuit 191 is relatively large in the circuit layout and the gate and the capacitor 11911 of the thin-layer transistor are usually non-light-transmitting metals, a projection of the gate and the capacitor 11911 of the thin-layer transistor included in the first pixel circuit 191 on the underlayer 113 of the array substrate 110 is configured to be covered by a non-light-transmitting sub-pixel 1202 connected to the first pixel circuit 191. In this manner, the gate and the capacitor 11911 of the thin-layer transistor do not fall outside the region corresponding to the non-light-transmitting electrode 1212, thereby helping to reduce the area of the non-light-transmitting regions AA11 and improve the light transmittance of the first display region AA1.

In an embodiment, in the first display region AA1, a light-transmitting sub-pixel 1201 and a non-light-transmitting sub-pixel 1202 share the first pixel circuit 191.

For example, since the light-transmitting sub-pixel 1201 is light-transmitting, if the same configuration method as that of the non-light-transmitting sub-pixel 1202 is adopted, that is, when the pixel circuit connected to the light-transmitting sub-pixel 1201 is separately provided and the gate and the capacitor 11911 of the thin-layer transistor is provided under the light-transmitting sub-pixel 1201, the area of the non-light-transmitting region is increased. However, in the present embodiment, a pixel circuit is in no need to be separately provided for the light-transmitting sub-pixel 1201 so that the area of the non-light-transmitting region does not increase.

On the basis of the above embodiments, in an embodiment, the light-transmitting sub-pixel 1201 and the non-light-transmitting sub-pixel 1202 are both connected to the first pixel circuit 191 closest to the light-transmitting sub-pixel 1201 so that the connection between the sub-pixel 1201 and the first pixel circuit 191 is easier to achieve. Illustratively, the minimum repeating unit 1220 in FIG. 8 is taken as an example. The green sub-pixel in the first row of the second column is a light-transmitting sub-pixel 1201, and the first pixel circuit 191 closest to the light-transmitting sub-pixel 1201 is the first pixel circuit 191 connected to the blue non-light-transmitting sub-pixel in the second row of the second column, so the green light-transmitting sub-pixel in the first row of the second column may be connected to the same pixel circuit as the blue non-light-transmitting sub-pixel in the second row of the second column does.

Figure 10:
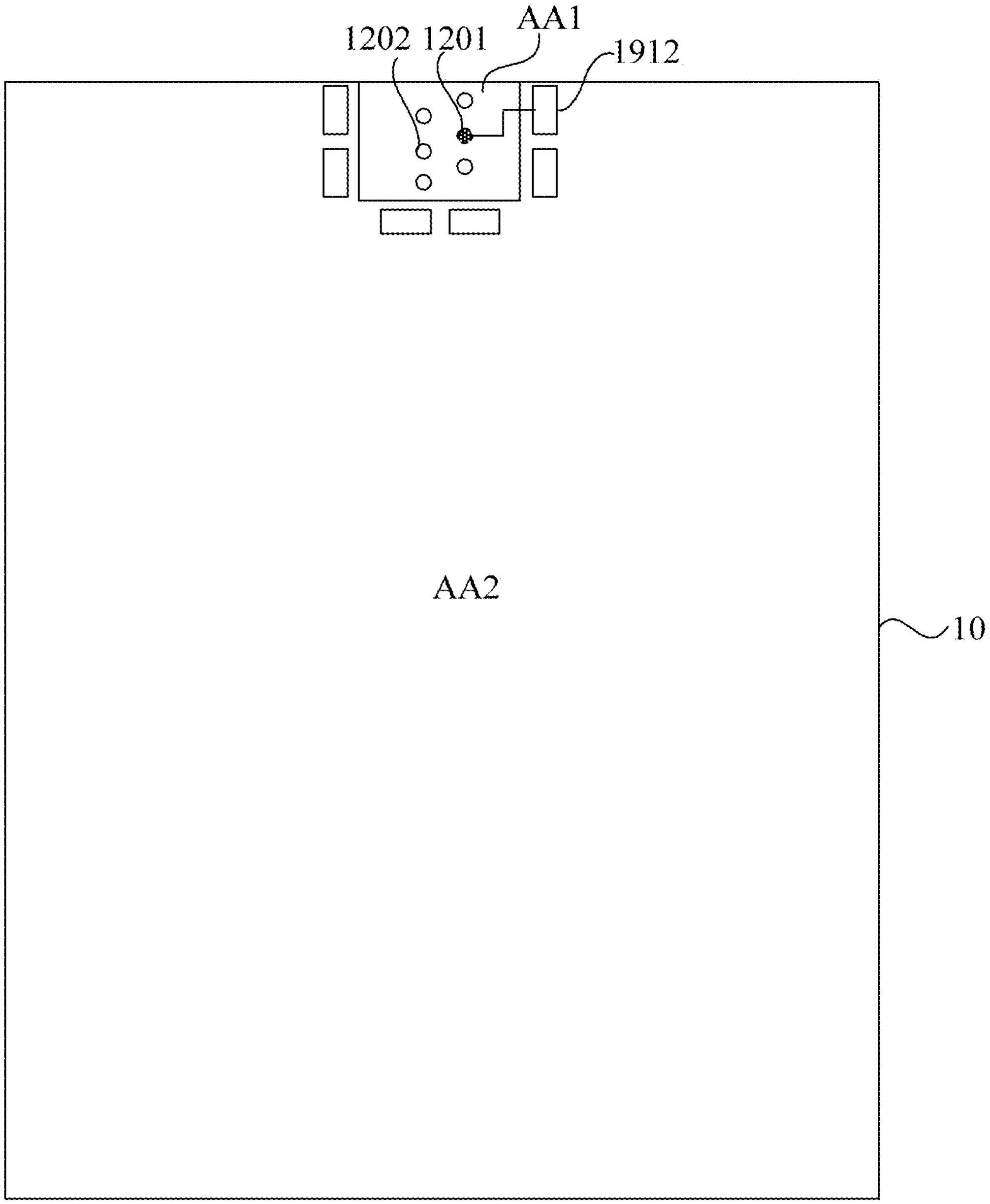
FIG. 10 is a top view of another display panel according to an embodiment of the present application.

FIG. 10 is a top view of another display panel according to an embodiment of the present application. In conjunction with FIGS. 1 and 10, in an embodiment, the display panel further includes a second display region AA2 connected to the first display region AA1. Each of at least part of the layers is provided with a plurality of second pixel circuits 1912 located in the second display region AA2 adjacent to an edge of the first display region AA1. Each second pixel circuit 1912 is connected to at least one of the light-transmitting sub-pixels 1201.

For example, configuring the second pixel circuit 1912 to be in the second display region AA2 can increase the area of the light-transmitting region AA11 in the first display region AA1. In addition, the light-transmitting sub-pixel 1201 can be separately provided with a pixel circuit so that one-to-one electrical connection between the sub-pixels and the pixel circuits can be realized, which helps to improve the display effect.

With continued reference to FIG. 10, in an embodiment, the display panel further includes a second display region AA2. The second display region AA2 includes at least non-light-transmitting sub-pixels 1202.

In an embodiment, the light transmittance of the second display region AA2 is smaller than the light transmittance of the first display region AA1.

For example, the second display region AA2 may only include non-light-transmitting sub-pixels 1202. The second display region AA2 only includes non-light-transmitting sub-pixels 1202, and the non-light-transmitting sub-pixels 1202 in the second display region AA2 may be arranged in an array to ensure that the second display region AA2 has a normal display effect.

In an embodiment, the second display region AA2 further includes light-transmitting sub-pixels 1201.

In an embodiment, the arrangement of sub-pixels in the first display region AA1 and the second display region AA2 is the same, that is, the arrangement of sub-pixels in the first display region AA1 and the second display region AA2 may be obtained by translating the same minimum repeating unit. The design of the pixel circuit in the second display region AA2 may be the same as the design of the pixel circuit in the first display region AA1. For example, one pixel circuit drives multiple sub-pixels. The design of the pixel circuit in the second display region AA2 may also be applied to connect one pixel circuit to one sub-pixel in a one-to-one manner. The design of the pixel circuit in the display region may be changed according to requirements.

What is claimed is:

1. A display panel, comprising a first display region with a plurality of light-transmitting sub-pixels and a plurality of non-light-transmitting sub-pixels, wherein the plurality of light-transmitting sub-pixels and the plurality of non-light-transmitting sub-pixels are arranged in a preset pixel arrangement structure in the first display region, the plurality of non-light-transmitting sub-pixels are randomly arranged in at least one set region of the first display region, and the at least one set region comprises at least a portion of the first display region, the display panel comprises an array substrate, a first electrode layer, a light-emitting layer, and a second electrode layer stacked in sequence, the array substrate comprises a plurality of layers stacked with each other, part of the plurality of layers are light-transmitting layers, the other part of the plurality of layers are non-light-transmitting layers, a projection of each of the non-light-transmitting layers in a thickness direction of the array substrate does not overlap a projection of the light-transmitting electrode in the thickness direction of the array substrate, and each of the light-transmitting layers comprises a light-transmitting wiring layer located in the first display region, the light-transmitting wiring layer comprises a plurality of light-transmitting wires and a groove between adjacent ones of the plurality of light-transmitting wires, and the groove serves as a hollowed-out region of the light-transmitting wiring layer.

2. The display panel according to claim 1, further comprising a plurality of pixel units arranged in the preset pixel arrangement structure in the first display region, wherein each pixel unit of the plurality of pixel units comprises a plurality of sub-pixels, and each sub-pixel of the plurality of sub-pixels is selected from the plurality of light-transmitting sub-pixels or the plurality of non-light-transmitting sub-pixels.

3. The display panel according to claim 1, wherein:

the first electrode layer comprises a plurality of first electrodes, and the light-emitting layer comprises a plurality of light-emitting material units in one-to-one correspondence to the plurality of first electrodes, a light-transmitting sub-pixel of the plurality of light-transmitting sub-pixels comprises a first electrode, a light-transmitting material unit corresponding to the first electrode, and a first portion electrode layer of the second electrode layer, a projection of the first portion electrode layer of the second electrode layer in a thickness direction of the display panel overlaps a projection of the first electrode in the light-transmitting sub-pixel in the thickness direction of the display panel; and a non-light-transmitting sub-pixel of the plurality of non-light-transmitting sub-pixels comprises a first electrode, a light-transmitting material unit corresponding to the first electrode, and a second portion electrode layer of the second electrode layer, a projection of the second portion electrode layer of the second electrode layer in the thickness direction of the display panel overlaps a projection of the first electrode in the non-light-transmitting sub-pixel in the thickness direction of the display panel, the first electrode of the non-light-transmitting sub-pixel is a non-light-transmitting electrode, the first electrode of the light-transmitting sub-pixel is a light-transmitting electrode, and the first electrode of the non-light-transmitting sub-pixel is randomly arranged in the at least one set region of the first display region.

4. The display panel according to claim 3, wherein the non-light-transmitting electrode comprises a first transparent conductive layer, a metal conductive layer, and a second transparent conductive layer that are stacked with each other.

5. The display panel according to claim 4, wherein the light-transmitting electrode comprises a first transparent conductive layer, a metal conductive layer, and a second transparent conductive layer that are stacked with each other, wherein a thickness of the metal conductive layer of the light-transmitting electrode is smaller than a thickness of the metal conductive layer of the non-light-transmitting electrode.

6. The display panel according to claim 3, wherein the light-transmitting electrode comprises a transparent conductive layer.

7. The display panel according to claim 1, further comprising:

a compensation layer located in the array substrate in the first display region, wherein a projection of the compensation layer on the light-transmitting wiring layer covers at least part of hollowed-out regions in the light-transmitting wiring layer.

8. The display panel according to claim 7, wherein a material of the compensation layer is the same as a material of the light-transmitting wiring layer, or a thickness of the compensation layer is equal to a thickness of the light-transmitting wiring layer.

9. The display panel according to claim 1, wherein the first display region further comprises an optical modulation layer sandwiched between two adjacent ones of the light-transmitting layers, and the optical modulation layer is configured to increase a transmittance of light with a preset wavelength passing through the two adjacent ones of the light-transmitting layers between which the optical modulation layer is sandwiched.

10. The display panel according to claim 2, wherein the at least one set region comprises a plurality of set regions, and each of the plurality of set regions comprises a minimum repeating unit of pixel arrangement, wherein minimum repeating units in the first display region are the same in terms of an arrangement mode of the plurality of light-transmitting sub-pixels and in terms of an arrangement mode of the plurality of non-light-transmitting sub-pixels, and non-light-transmitting sub-pixels in each of the minimum repeating units are randomly arranged.

11. The display panel according to claim 10, wherein the minimum repeating unit comprises at least two columns of sub-pixels, and non-light-transmitting sub-pixels in each column of at least one column of the at least two columns of sub-pixels are arranged differently from non-light-transmitting sub-pixels in another column of the at least two columns of sub-pixels; or the minimum repeating unit comprises at least two rows of sub-pixels, and non-light-transmitting sub-pixels in each row of at least one row of the at least two rows of sub-pixels are arranged differently from non-light-transmitting sub-pixels in another row of the at least two rows of sub-pixels.

12. The display panel according to claim 10, wherein the minimum repeating unit comprises at least two columns of sub-pixels, and a number of non-light-transmitting sub-pixels in each column of at least one column of the at least two columns of sub-pixels is different from a number of non-light-transmitting sub-pixels in another column of the at least two columns of sub-pixels; or the minimum repeating unit comprises at least two rows of sub-pixels, and a number of non-light-transmitting sub-pixels in each row of at least one row of the at least two rows of sub-pixels is different from a number of non-light-transmitting sub-pixels in another row of the at least two rows of sub-pixels.

13. The display panel according to claim 10, wherein the minimum repeating unit comprises at least two columns of sub-pixels, and in each column of the at least two columns of sub-pixels, a distance between two adjacent non-light-transmitting sub-pixels constituting a pair among at least one pair of non-light-transmitting sub-pixels is different from a distance between two adjacent non-light-transmitting sub-pixels constituting a pair other than the at least one pair of non-light-transmitting sub-pixels; or the minimum repeating unit comprises at least two rows of sub-pixels, and in each row of the at least two rows of sub-pixels, a distance between two adjacent non-light-transmitting sub-pixels constituting a pair among at least one pair of non-light-transmitting sub-pixels is different from a distance between two adjacent non-light-transmitting sub-pixels constituting a pair other than the at least one pair of non-light-transmitting sub-pixels.

14. The display panel according to claim 10, wherein sub-pixels in the minimum repeating unit are arranged in an array, wherein at least one column of sub-pixels comprises at least one light-transmitting sub-pixel of the plurality of the light-transmitting sub-pixels.

15. The display panel according to claim 1, wherein, in the first display region, in the thickness direction of the display panel, each of at least part of the plurality of layers is provided with a plurality of first pixel circuits, wherein a first pixel circuit of the plurality of first pixel circuits comprises a thin-layer transistor, the thin-layer transistor comprises a gate and a capacitor, and a projection of the gate and the capacitor on the array substrate is covered by a corresponding non-light-transmitting sub-pixel connected to the first pixel circuit.

16. The display panel according to claim 15, wherein in the first display region, a light-transmitting sub-pixel of the plurality of light-transmitting sub-pixels and a non-light-transmitting sub-pixel of the plurality of non-light-transmitting share the first pixel circuit; and the light-transmitting sub-pixel and the non-light-transmitting sub-pixel are connected to a first pixel circuit of the plurality of first pixel circuits closest to the light-transmitting sub-pixel.

17. The display panel according to claim 15, wherein the display panel further comprises a second display region connected to the first display region, each of at least part of the plurality of layers is provided with a plurality of second pixel circuits, wherein the plurality of second pixel circuits are located in the second display region and adjacent to an edge of the first display region, and each second pixel circuit is connected to at least one of the plurality of light-transmitting sub-pixels in the first display region.

* * * * *